(12) United States Patent
Colosi et al.

(10) Patent No.: US 12,238,883 B2
(45) Date of Patent: Feb. 25, 2025

(54) DAUGHTER-CARD RETENTION SYSTEM

(71) Applicant: Penn Engineering & Manufacturing Corp., Danboro, PA (US)

(72) Inventors: Anthony Colosi, Quakertown, PA (US); Dustin Hallenbeck, San Jose, CA (US); Brian G. Bentrim, Furlong, PA (US)

(73) Assignee: Penn Engineering & Manufacturing Corp., Danboro, PA (US)

( * ) Notice: Subject to any disclaimer, the term of this patent is extended or adjusted under 35 U.S.C. 154(b) by 373 days.

(21) Appl. No.: 17/897,805

(22) Filed: Aug. 29, 2022

(65) Prior Publication Data

US 2023/0063765 A1 Mar. 2, 2023

Related U.S. Application Data

(60) Provisional application No. 63/238,564, filed on Aug. 30, 2021.

(51) Int. Cl.
*H05K 7/02* (2006.01)
*H05K 1/14* (2006.01)

(52) U.S. Cl.
CPC ............... *H05K 7/02* (2013.01); *H05K 1/14* (2013.01)

(58) Field of Classification Search
CPC .................................................. H05K 7/02
USPC ............................................................ 361/784
See application file for complete search history.

(56) References Cited

U.S. PATENT DOCUMENTS

| | | | | |
|---|---|---|---|---|
| 3,829,741 | A * | 8/1974 | Athey | H05K 3/366 361/801 |
| 5,074,807 | A * | 12/1991 | Parmer | H01R 43/26 439/571 |
| 5,413,497 | A * | 5/1995 | Lwee | H01R 12/721 439/328 |
| 9,634,430 | B1 * | 4/2017 | Yu | H01R 12/721 |
| 2002/0090844 | A1 * | 7/2002 | Kocin | H05K 1/14 439/74 |
| 2003/0044127 | A1 * | 3/2003 | Roth | G02B 6/3849 385/88 |
| 2004/0233617 | A1 * | 11/2004 | Martin | H05K 7/1431 361/600 |
| 2005/0164540 | A1 * | 7/2005 | Korsunsky | H05K 7/142 439/328 |
| 2007/0105425 | A1 * | 5/2007 | Wang | H05K 7/142 439/326 |
| 2021/0168959 | A1 * | 6/2021 | Xu | H05K 7/1417 |

* cited by examiner

*Primary Examiner* — Stanley Tso
(74) *Attorney, Agent, or Firm* — Gregory J. Gore, Esq.

(57) ABSTRACT

A circuit board fastening system consists of a two-piece assembly including an electrically conductive circuit board retainer for surface mounting and a flexible clip for retaining a daughter-card to the retainer. The clip is preferably made of a flexible polymer so that a band portion in the middle of the clip can be comfortably folded 180 degrees at a u-shaped bend. During assembly, an arrow-shaped barb at one end of the clip is inserted into a retain bore thereby resiliently securing the daughter-card to a retainer flange upon which the card is seated. At the opposite end of the clip, a notched aperture in the clip is affixed around a groove in the retainer flange. The resilience of the barb provides a residual clamping effect to the daughter-card that is tightly sandwiched between a broad planar portion of the clip and a top surface of the retainer flange.

15 Claims, 1 Drawing Sheet

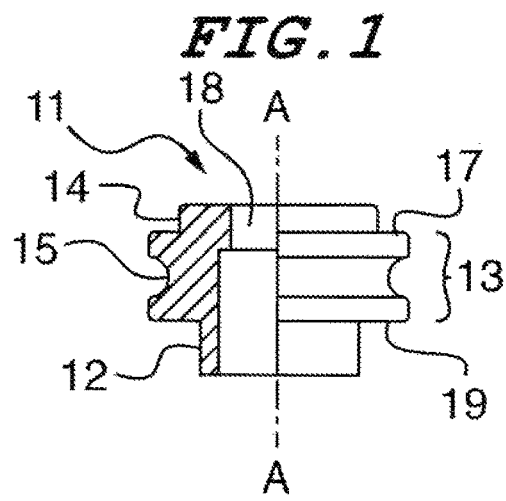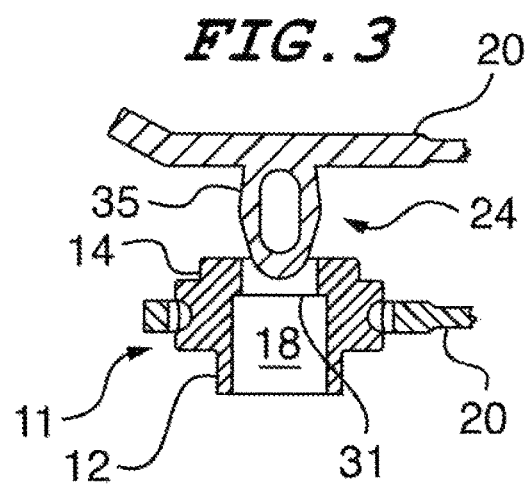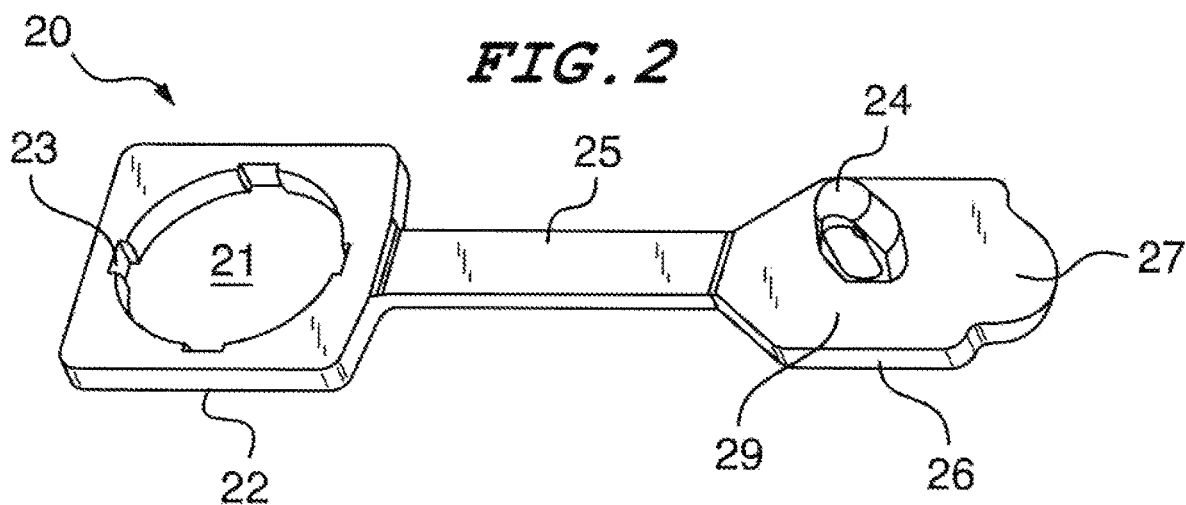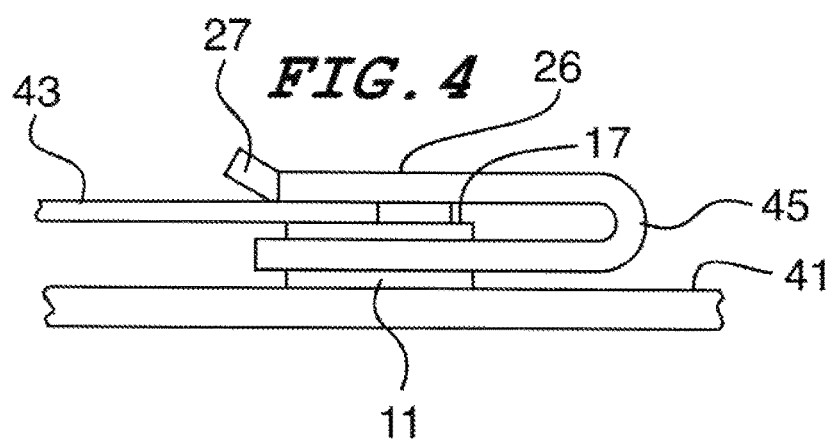

DAUGHTER-CARD RETENTION SYSTEM

RELATED APPLICATIONS

This is a non-provisional patent application related to provisional patent application Ser. No. 63/238,564 entitled, "Daughter Card Retention System" filed on Aug. 30, 2021 priority from which is hereby claimed.

FIELD OF THE INVENTION

The present invention relates to circuit board fastening systems used in the electronics industry. More specifically it relates to the attachment of so-called "daughter-cards" to a motherboard.

BACKGROUND OF THE INVENTION

Currently, daughter-cards and in particular M.2 type cards are mounted to a motherboard via two connections. The first is the electrical connection for the board to communicate with the card. This connection is typically secured vertically. Then, the daughter card is laid down parallel to the motherboard where it is secured by the second connection, a grounding portion typically mounted via loose screw and retainer. The disadvantage to this technology is that the need for a loose screw is required which in turn necessitates hand or machine assembly of that screw after placing mating the daughter-card.

A known alternative to this design is a spring-loaded plastic slide-clip. This clip can be mounted to the motherboard via surface mount technology (SMT); however, this slide-clip requires a larger footprint of the motherboard. There is therefore a need in the electronic circuit board art for a daughter-card mounting system which is both compact and which eliminates any loose hardware.

SUMMARY OF THE INVENTION

The daughter-card retention fastening system of the present invention seeks to solve both of these problems. The solution provides a compact, low profile-SMT design that requires no loose hardware. The fastening system of the present invention is a self-contained, low profile, tool-less solution for mounting daughter cards to a motherboard. This product was designed with the goal to provide a low profile, cheaper, and easy-to-assemble SMT-enabled system for M.2 boards that can be modified to any size M.2 card at any height. This solution may be expanded to other boards outside the scope of M.2 cards to other daughter-card/motherboard interfaces.

More specifically, the applicant has devised a fastening system for a circuit board, comprising a circuit board having a hole for receiving a retainer and an elastomeric clip for holding an electronic component against the retainer. The retainer has top and bottom ends with a bore extending along a central longitudinal axis between them. A shank of the retainer is received in the circuit board hole. A flange on the retainer has a planar top surface perpendicular to the axis upon which the electronic component can rest. A groove in the flange extends around its peripheral surface for receiving a tail end portion of the clip to tether the clip to the retainer. A neck portion of the retainer extends upwardly from the flange top surface to the top end of the retainer. The elastomeric clip has a tail end and means for receipt and attachment to the retainer bore at an opposite attachment end. A flexible central band portion of the clip extends between the clip ends. When assembled, the electronic component is tightly sandwiched between the clip attachment end and the top surface of the retainer flange. The clip is a unitary part of a molded plastic material which has a flexible band portion with a u-shaped bend such that said clip ends extend in the same direction and parallel to one another as they join the retainer.

The means for affixation to the retainer at the tail end of the clip is an aperture through the body of the clip which has portions of a notched inner wall that engage the retainer groove. At the opposite end of the clip the attachment means of the clip which is received in the retainer bore is an arrow-shaped barb with a reverse angle tapered backend portion. The arrow-shaped barb extends orthogonally from the clip attachment end which has a broad planar surface extending to the lateral edges of the clip from a base of the barb. The barb is held to the retainer bore aided by a stepped construction of the bore which has a collar perpendicular to the axis that extends between top and bottom portions of the bore of different diameters. The backend portion of the barb engages the bore collar when the clip is fully seated into the retainer. The backend of the barb has a smooth, uninterrupted linear taper to accommodate depth variance tolerance. In this way, a residual clamp force is applied to the electronic component against the retainer flange top surface. A finger tab extending distally from the attachment end of the clip facilitates the manual retraction of the barb from the retainer.

As explained above, in one embodiment of the invention the circuit board is a motherboard and the electronic component is a daughter-card. Also, the retainer can be electrically conductive such that said electronic component electrically connected to the circuit board.

It is therefore the object of the invention to provide a daughter-card mounting system which eliminates loose hardware, and which allows a compact motherboard footprint. These and other objects of the invention which will become apparent to those of skill in the circuit board mounting arts from the following drawings and a description of one embodiment of the invention.

BRIEF DESCRIPTION OF THE DRAWINGS

FIG. 1 is an elevation partial sectional view of the retainer component of the invention.

FIG. 2 is a top front isometric view of the clip component of the invention in its free state.

FIG. 3 is an elevation sectional view of the clip and retainer of the invention in their assembly position.

FIG. 4 is an elevation side view of a daughter-card to motherboard assembly utilizing the present invention.

DESCRIPTION OF PREFERRED EMBODIMENTS OF THE INVENTION

In order to accomplish the objects of the invention, the circuit board retainer 11 of one embodiment has been devised as seen in FIG. 1. The retainer has a clip receiving hole, bore 18, that accepts the arrow-shaped clip barb seen in FIG. 3. An external groove 15 around a flange 13 accepts a closely fitted aperture in the tail end of the clip band as seen in FIG. 4 to tether the clip to the retainer. The clip and retainer are preassembled prior to motherboard mounting to eliminate the need for any loose hardware. The retainer 11 has a neck portion 14 at the top which locates the contact surface of the daughter-card and seats the backside of the daughter-card against the retainer flange top surface 17. The bottom of the retainer includes a shank 12 for insertion into a circuit board mounting hole and seating the retainer on the motherboard as seen in FIG. 4.

Referring now to FIGS. 2-4, one embodiment of the present fastening system is a two-piece assembly consisting of a steel retainer 11, seen in FIG. 1 for circuit surface mounting and a Nylon® clip 20 for retaining a daughter-card and providing electrical connection to the retainer. An isometric depiction of an unbent clip band in its free state is shown in FIG. 2.

Similar to the retainer, the clip 20 contains several features to ensure the assembly system's advantages. The clip 20 is preferably made of a rigid yet flexible polymer so that the middle of the clip, a band portion 25, can be comfortably folded 180 degrees at a u-shaped bend as seen in FIG. 4. Utilizing such a polymer also allows for the arrow-shaped barb 24 at the end of the clip band seen in FIG. 3 to resiliently secure the daughter-card to the retainer as seen in FIG. 4. The attachment end of the clip can be easily removed as needed by a finger tab extending from the distal end that provides a surface to detach clip barb by hand. A broad planar surface 29 at the attachment end of the clip band at the base of the barb 24 extends to the lateral edge of the band. This construction can be modified for various card thicknesses and height between the motherboard and daughter-card.

With continued reference to FIG. 3, as the arrow-shaped barb 24 of the clip 20 is pressed into the retainer receiving bore, the sides of the barb compress and the arrow shape elongates as the clip interferes with the bore 18. Once the clip passes into the bore 18 at the barb's widest point, the clip then begins to return elastically to its original form pressing a reverse-tapered backend portion of the barb 35 against a collar 31 inside the retainer bore. The backend portion of the barb provides a smooth, uninterrupted linear engagement surface. The collar 31 extends perpendicularly between top and bottom portions of the retainer bore of different diameters. By this means of attachment the daughter-card is tightly held in place sandwiched between the clip and a top surface of the retainer flange. Thus, the retainer has both internal and external means for securing the clip 20 at its opposite ends. Finally, the SMT shank 12 is designed per application to properly seat the retainer for SMT placement on the motherboard.

Referring now to FIG. 4, an example of an assembled motherboard and daughter-card utilizing this embodiment of the invention is depicted. The grooved ring around the retainer holds the tail end of the clip as seen in FIGS. 1 and 2 and is assembled prior to installation to ensure the elimination of any loose hardware. The clip is preferably composed of Nylon® and has a band portion 25 at its midsection which is flexible enough in the orthogonal longitudinal plane so that the clip can easily be folded over forming u-shaped bend 45. This results in both ends extending in parallel and in the same direction. When the clip barb is fully inserted into the retainer bore as seen in FIG. 4, the daughter-card 43 is securely clamped between the arrow-shaped barb at the end 26 of the clip and the retainer 11. The elasticity of the attachment barb provides a residual clamp force to the daughter-card. The length of the neck portion of the retainer is selected to be slightly less than the thickness of the daughter card to ensure good electrical contact between the card and the retainer. The retainer 11 is preferably surfaced mounted to circuit board 41 and is designed to fit in a low profile hole around the same size as the card mounting radius.

From the foregoing description of one embodiment of the invention it will be apparent to those of skill in the art to which the invention pertains that the objects of the invention to devise a daughter card mounting system which is both compact and which eliminates loose hardware has been achieved. There may be various modifications and adaptations of what has been disclosed without departing from the spirit and scope of the invention which is to be determined solely by the following claims and their legal equivalents.

What is claimed is:

1. A fastening system for a circuit board, comprising:
   a circuit board having a hole for receiving a fastener;
   a retainer having top and bottom ends with a bore extending along a central longitudinal axis, said retainer having a shank received in the circuit board hole;
   a flange on the retainer, said flange having a planar top surface perpendicular to the axis;
   a groove in the flange extending around its peripheral surface;
   a neck portion of the retainer extending upwardly from the flange top surface to the top end of the retainer;
   an elastomeric clip having means for affixation to the retainer groove at a tail end thereof and having means for receipt and attachment to the retainer bore at an opposite attachment end of the clip; and
   an electronic component tightly sandwiched between the clip attachment end and the top surface of the retainer flange.

2. The fastening system of claim 1 wherein the clip has a u-shaped bend such that said clip ends extend in the same direction and parallel to one another.

3. The fastening system of claim 1 wherein the means for affixation to the retainer at the tail end is an aperture with portions of an inner wall that engage the retainer groove.

4. The fastening system if claim 3 wherein the inner wall of the clip tail end aperture has notches.

5. The fastening system of claim 1 wherein the attachment means of the clip which is received in the retainer bore is an arrow-shaped barb with a reverse-angle tapered backend portion.

6. The fastening system of claim 5 wherein the retainer bore is stepped, having a collar perpendicular to the axis and extending between top and bottom portions of the bore of different diameters.

7. The fastening system of claim 6 wherein the backend portion of the barb engages the bore collar.

8. The fastening systems of claim 7 wherein the backend portion of the barb has a smooth uninterrupted linear surface.

9. The fastening system of claim 5 wherein the arrow-shaped barb extends orthogonally from a broad planar surface at the attachment end of the clip that extends to the lateral edges of the clip from a base of the arrow-shaped barb.

10. The fastening system of claim 1 constructed and arranged such that a residual clamp force is applied to the electronic component against the retainer flange top surface.

11. The fastening system of claim 1 further having a finger tab extending distally from the attachment end of the clip.

12. The fastening systems of claim 1 wherein the circuit board is a motherboard and the electronic component is a daughter-card.

13. The fastening system of claim 1 wherein the retainer is electrically conductive such that said electronic component electrically connected to the circuit board.

14. The fastening system of claim 1 wherein the clip is a unitary part of a molded plastic composition.

15. The fastening system of claim 1 wherein the clip has a flexible band portion at it midsection.

\* \* \* \* \*